(12) United States Patent
Kumazawa et al.

(10) Patent No.: US 6,897,011 B2
(45) Date of Patent: May 24, 2005

(54) PHOTOSENSITIVE COMPOSITION FOR SANDBLASTING AND PHOTOSENSITIVE FILM USING THE SAME

(75) Inventors: Akira Kumazawa, Kanagawa (JP); Ryuma Mizusawa, Kanagawa (JP); Syunji Nakazato, Kanagawa (JP); Hiroyuki Obiya, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/801,449

(22) Filed: Mar. 16, 2004

(65) Prior Publication Data

US 2004/0175659 A1 Sep. 9, 2004

Related U.S. Application Data

(63) Continuation of application No. 09/993,090, filed on Nov. 6, 2001, now abandoned.

(30) Foreign Application Priority Data

Nov. 7, 2000 (JP) ........................................ 2000-338460

(51) Int. Cl.$^7$ .............................................. G03F 7/027
(52) U.S. Cl. ...................... 430/323; 430/316; 430/317; 430/318
(58) Field of Search ................................ 430/323, 316, 430/317, 318

(56) References Cited

U.S. PATENT DOCUMENTS 3,469,982 A    9/1969   Celeste
4,245,030 A    1/1981   Faust et al.
4,629,680 A   12/1986   Iwasaki et al.
4,925,768 A    5/1990   Iwasaki et al.

FOREIGN PATENT DOCUMENTS

| DE | 199 38 850 | 2/2000 | |
| EP | 0 741 332 | 6/1996 | |
| EP | 0 770 923 | 2/1997 | |
| JP | 55-103554 | 8/1980 | |
| JP | 60-010242 | 1/1985 | |
| JP | 02-069754 | 3/1990 | |
| JP | 06-161098 | 6/1994 | |
| JP | 10-239840 A | * 9/1998 | ........... G03F/7/027 |

OTHER PUBLICATIONS

Hiroo et al, Publication No. 10–239840, Patent Abstracts of Japan with attached English Machine translation of said document which is for Japanese 10–239840 published Sep. 11, 1998, pp. 2of2, 1of1, 1of1 and 1–14 copyright Japan Patent Office.*

Derwent–ACC–No: 1998–546328, English abstract of JP 10239840A, 2 pages, copyright 1999, Derwent Information LTD.*

* cited by examiner

*Primary Examiner*—Cynthia Hamilton
(74) *Attorney, Agent, or Firm*—Fish & Richardson P.C.

(57) ABSTRACT

A photosensitive composition for sandblasting comprising the components of: (A) a photopolymerizable urethane (meth)acrylate oligomer comprising (meth)acryloyl group; (B) an acrylic copolymer; and (C) a photopolymerization initiator, wherein the component (B) comprises, as a monomer unit, one of copolymerizable monomers comprising one of a benzene ring and a cyclohexyl group.

1 Claim, No Drawings

PHOTOSENSITIVE COMPOSITION FOR SANDBLASTING AND PHOTOSENSITIVE FILM USING THE SAME

This application is a continuation of, and claims priority under 35 U.S.C. 120 to U.S. patent application Ser. No. 09/993,090, filed Nov. 6, 2001, now abandoned. This application also claims the benefit of Japanese Patent Application No. 2000-338460, filed Nov. 7, 2000.

FIELD OF THE INVENTION

The present invention relates to a novel photosensitive composition for sandblasting and, more particularly, to a photosensitive composition for sandblasting which is inexpensive, which shows an excellent alkali developability, a high sensitivity, a high adhesion to a substrate, a high elasticity and a high flexibility after patterning and an excellent resistance to sandblasting, and which permits fine processing with ease, and to a photosensitive film using the same.

BACKGROUND OF THE INVENTION

Sandblasting is one of the conventionally known processing methods for patterning the surface of a substrate such as glass, stone, plastics, ceramics, leather, andwood. The sandblasting is a processing method wherein a rubber sheet, paper or the like is pasted on the surface of a substrate and cut out to conduct patterning, then an abrasive or the like is blown against the patterned surface to selectively engrave the substrate. In particular, a sandblasting method, in which a mask pattern is formed in a photosensitive composition layer for sandblasting formed on the surface of a substrate by photolithography and selective engraving is conducted by blowing an abrasive material or the like (hereinafter referred to as "sandblasting method based on photolithography"), provides a high working efficiency and permits fine processing, thus being effective for formation of a circuit board where a metal pattern and an insulation pattern coexist, especially for formation of a metal wiring pattern or an insulation pattern made of ceramics, fluorescence substances, etc. of a plasma display.

Photosensitive compositions for sandblasting utilizing the lithography which have been proposed to date for use in sandblasting include a photosensitive composition containing a urethane prepolymer having an ethylenically unsaturated group at the terminal, a mono-functional ethylenically unsaturated compound and a polymerization initiator (JP-A-60-10242 (The term "JP-A" as used herein means an "unexamined published Japanese patent application")), a photosensitive composition containing an unsaturated polyester, an unsaturated monomer and a photopolymerization initiator (JP-A-55-103554), and a photosensitive composition comprising polyvinyl alcohol and a diazo resin (JP-A-2-69754). However, the above-described photosensitive resin compositions have the defects that film thickness control is difficult, that sensitivity, adhesion to a substrate and sandblast resistance are insufficient, and that fine processing is difficult.

As a photosensitive composition for sandblasting, which is free from the above defects, the applicant has formerly proposed in JP-A-6-161098 a photosensitive composition for sandblasting which mainly comprises a urethane oligomer having an ethylenically unsaturated group at the terminal and having incorporated therein a cellulose derivative and a polymerization initiator. While this photosensitive composition for sandblasting described in JP-A-6-161098 has an excellent alkali developability and is superior to the conventional ones in sensitivity, adhesion to a substrate, elasticity and flexibility after patterning, and sandblasting resistance, it is still insufficient in putting fine processing into practice. In addition, the cellulose resin used as abase resin is so expensive that the resulting photosensitive composition is costly. Hence, it has been attempted to develop a photosensitive composition capable of being put into practice by using a less expensive acrylic resin but, since the acrylic resin has a poor compatibility with a urethane oligomer, particularly a urethane oligomer having polyether structural units, formation of a good pattern has been difficult.

SUMMARY OF THE INVENTION

With the above-described circumstances in mind, the inventors have made intensive investigations and, as a result, have found that a photosensitive composition for sandblasting which has an improved compatibility with a urethane oligomer, particularly a urethane oligomer having a polyether structural unit, which is inexpensive, and which has an excellent alkali developability, a high sensitivity, high adhesion properties, a high elasticity and flexibility after patterning, and an excellent sandblast resistance, can be obtained by using as a component of the photosensitive composition for sandblasting an acrylic copolymer containing as a monomer unit at least one monomer selected from among copolymerizable monomers having a benzene ring or a cyclohexyl group, thus having completed the present invention.

That is, an object of the invention is to provide a photosensitive composition for sandblasting, which is inexpensive, which shows a high sensitivity, high adhesion properties, ahighelasticity and flexibility after patterning, and an excellent sandblast resistance, and which enables to well conduct fine processing of a metal pattern or an insulating pattern.

In addition, another object of the invention is to provide a photosensitive film using the above-described photosensitive composition for sandblasting.

The present invention attaining the above-described objects is directed to a photosensitive composition containing (A) a photopolymerizable urethane (meth)acrylate oligomer having (meth)acryloyl group, (B) an acrylic copolymer and (C) a photopolymerization initiator, in which the (B) acrylic copolymer is an acrylic copolymer containing as a monomer unit at least one member selected from copolymerizable monomers having a benzene ring or a cyclohexyl group.

The present invention is also directed to a photosensitive film using the same.

DETAILED DESCRIPTION OF THE INVENTION

The invention is now described in detail below.

[Urethane (Meth)acrylate Oligomer]

As is described above, the photosensitive composition of the invention contains (A) a photopolymerizable urethane (meth)acrylate oligomer having (meth)acryloyl group (hereinafter referred to as "component (A)"). The urethane (meth) acrylate oligomer is a reaction product obtained by the reaction of a compound having an isocyanate group (—NCO group) at a terminal, obtained by reacting a diol compound with a diisocyanate compound, and an acrylate compound or methacrylate compound having a hydroxyl group or a carboxyl group. The reaction product of the diol compound and the diisocyanate compound includes those compounds wherein a plurality of the compound molecules are linked to each other via urethane bond. As the component (A) to be used in the photosensitive composition for sandblasting, those compounds are preferred which contain 4 or more intramolecular urethane bonds, with the number of the urethane bonds being within the range where an elasticity required after curing by exposure to light can be maintained. In case where number of the urethane bonds is less than 4, there results an extremely reduced sandblast resistance, thus not being preferred.

As the diol compound forming the above-described component (A), there are illustrated polyesters and polyethers having a hydroxyl group at the terminals thereof. These diol compounds include, for example, polyesters obtained by ring-opening polymerization of lactones; polycarbonates; and diol compounds obtained by condensation reaction between an alkylene glycol or its polymer and a dicarbcxylic acid. Specific examples of the lactones are δ-valerolactone, ε-caprolactone, β-propiolactone, α-methyl-β-propiolactone, β-methyl-β-propiolactone, α-methyl-β-propiolactone, β-methyl-β-propiolactone, α,α-dimethyl-β-propiolactone, and β,β-dimethyl-β-propiolactone. Specific examples of the polycarbonates include reaction products between a diol such as bisphenol A, hydroquinone or dihydroxycyclohexane and a carbonyl compound such as diphenyl carbonate, phosgene or succinic anhydride. Further, specific examples of the alkylene glycols include ethylene glycol, propylene glycol, diethylene glycol, triethylene glycol, dipropylene glycol and neopentyl glycol and, as the polymers thereof, polymers obtained by addition polymerization of one, two or more of the aforesaid alkylene glycols. As specific examples of the dicarboxylic acids to be reacted with the alkylene glycols or the polymers thereof, there are illustrated maleic acid, fumaric acid, glutaric acid and adipic acid. Specific examples of the polyethers are polyethylene glycol, polypropylene glycol, polytetramethyleneglycol, and polypentamethyleneglycol. As a constituent of the polyesters and polyethers, 2,2-bis(hydroxymethyl)propionic acid, 2,2-bis(2-hydroxyethyl)propionic acid or 2,2-bis(3-hydroxypropyl) propionic acid, especially 2,2-bis(hydroxymethyl)propionic acid, are preferred, since they provide a urethane oligomer having an excellent solubility in an alkali solution. Especially, diols having (poly)alkylene glycol monomer units are preferred, since they improve strength of the urethane oligomers. The polyesters or polyethers may be used either independently or as a mixture of two or more thereof.

As the diisocyanate compounds to be reacted with the diol compound, there may specifically be illustrated aliphatic or alicyclic diisocyanate compounds such as dimethylene diisocyanate, trimethylene diisocyanate, tetramethylene diisocyanate, pentamethylene diisocyanate, hexamethylene diisocyanate, heptamethylene diisocyanate, 2,2-dimethylpentane-1,5-diisocyanate, octamethylene diisocyanate, 2,5-dimethylhexane-1,6-diisocyanate, 2,2,4-trimethylpentane-1,5-diisocyanate, nonamethylene diisocyanate, 2,2,4-trimethylhexane diisocyanate, decamethylene diisocyanate and isophorone diisocyanate. These compounds may be used either independently or as a mixture of two or more thereof.

Further, specific examples of the (meth) acrylate compound having a hydroxyl group which reacts with the isocyanate group-terminated compound include hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethylene glycol monoacrylate, ethylene glycol monomethacrylate, glycerol acrylate, glycerol methacrylate, dipentaerythritol monoacrylate, dipentaerythritol monomethacrylate, acrylic acid, methacrylic acid, phthalic acid ester with monohydroxyethyl acrylate and ω-carboxypolycaprolactone monoacrylate. These compounds may be used either independently or as a mixture of two or more thereof.

The component (A) has an average molecular weight of preferably 1,000 to 30,000. In case where the average molecular weight is less than 1,000, a cured film of the photosensitive composition has an increased bonding force to have an increased hardness, which reduces resistance to sandblasting. In case where the average molecular weight exceeds 30,000, the composition has an increased viscosity, which deteriorates coating properties and workability, and the resulting cured film will have an increased electrical insulating resistance, thus such average molecular weight not being preferred.

More preferably, the component (A) contains 50% by weight or more urethane (meth)acrylate oligomer having specific structural unit, which is polyether, in the main chain. Such oligomer serves to provide more strength and much more improve resistance to sandblasting.

The content of the component (A) is generally 10 to 90 parts by weight, preferably 30 to 70 parts by weight, based on 100 parts of the total amount of the components (A), (B) and (C). In case where the content is less than 10 parts by weight, there result insufficient adhesion properties, an insufficient elasticity, an insufficient flexibility and a deteriorated resistance to sandblasting. In case where the content exceeds 90 parts by weight, there results a decreased compatibility with other components, which will cause phase separation during storage, thus such content not being preferred.

[Acrylic Copolymer]

As the (B) acxrylic copolymer of the invention (hereinafter referred to as "component (B)"), there are illustrated, as described hereinbefore, those acrylic copolymers which contain at least one of copolymerizable monomers having a benzene ring or a cyclohexyl group as monomer unit, and which can form a film having an excellent sandblasting resistance and is soluble in water or an alkali aqueous solution in a development processing step. By the use of the acrylic copolymers which contain at least one of copolymerizable monomers having a benzene ring or a cyclohexyl group as monomer unit, compatibility with the component (A) is improved so much that inexpensive acrylic polymers are permitted to use as a base resin, with reducing the amount of the component (A). Thus, a practical photosensitive composition for sandblasting can be produced at a low production cost. This component (B) can be produced by copolymerising the copolymerizable monomer having a benzene ring or a cyclohexyl group with a properly selected known (meth)acrylate, ethylenically unsaturated carboxylic acid and/or other copolymerizable monomer or monomers. Specific examples of the copolymerizable monomer having a benzene ring or a cyclohexyl group include benzyl acrylate, benzyl methacrylate, cyclohexyl acrylate, cyclohexyl methacrylate, phenoxyethyl acrylate, phenoxyethyl methacrylate, phenoxy polyethylene glycol acrylate, phenoxy polyethylene glycol methacrylate, styrene, nonylphenoxy polyethylene glycol monoacrylate, nonylphenoxy polyethylene glycol monomethacrylate, nonylphenoxy polypropylene monoacrylate, nonylphenoxy polypropylene monomethacrylate, 2-hydroxy-3-phenoxypropyl acrylate, 2-acryloyloxyethyl phthalate and 2-acryloyloxyethyl-2-hydroxyethyl phthalate. An amount of the copolymerizable monomer having a benzene ring or a cyclohexyl group included, as monomer units, in the component (B) is 2 to 70% by weight, preferably 2 to 30% by weight. In case where the amount is less than 2% by weight, compatibility with the component (A) is decreased so much that phase separation takes place during storage whereas, in case where the amoung exceeds 70% by weight, developability of the resulting photosensitive composition for sandblasting is decreased, thus such ratio not being preferred.

As the (meth)acrylates, there are illustrated, for example, acrylic and methacrylic acid esters containing 1 to 10 carbon atoms in the ester moiety. Specific examples thereof include methyl acrylate, ethyl acrylate, methyl methacrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methalcrylate, 4-hydroxybutyl acrylate, 4-hydroxybutyl methacrylate, 3-ethylhexyl acrylate, ethylene glycol monoacrylate, ethylene glycol monomethacrylate, glycerol acrylate, glycerol methacrylate, dipentaerythritol monoacrylate, dipentaerythritol monomethacrylate, dimethylaminoethyl acrylate, dimethylaminoethyl methacrylate, tetrahydrofururyl acrylate and tetrahydrofurfuryl methacrylate. Specific examples of the ethylenically unsaturated carboxylic acid include acrylic acid, methacrylic acid, crotonic acid, cinnamic acid, maleic acid, maleic anhydride, fumaric acid, itaconic acid, itaconic anhydride, citraconic acid and citraconic anhydride. Of these, acrylic acid and methacrylic acid are preferably used.

As the other copolymerizable monomer, there may be illustrated, for example, those fumarates, maleates, crotonates and itaconates which have the ester moiety of the aforesaid (meth)acrylates, styrene, α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, vinyl acetate, vinyl butyrate, vinyl propionate, acrylamide, methacrylamide, acrylonitrile, methacrylonitrile, isoprene, chloroprene and 3-butadiene.

The component (B) is synthesized preferably by radical copolymerization reaction and, as a polymerization catalyst to be,used, there may be illustrated azo compounds such as 2,2'-azobisisobutyronitrile, 2,2'-azobis-(2,4-dimethylvaleronitrile) and 2,2'-azobis-(4-methoxy-2-dimethylvaleronitrile); organic peroxides such as benzoylperoxide, lauroyl peroxide, tert-butylperoxy pivalate and 1,1'-bis-(tert-butylperoxy)cyclohexane. In case where the peroxides are used as the radical polymerization initiator, those redox type polymerization initiators may be used which are combined with a reducing agent.

The thus obtained component (B) has an acid value of preferably 50 to 250 mgKOH/g. In case where the acid value is less than 50 mgKOH/g, development processing is difficult whereas, in case where the acid value exceeds 250 mgKOH, there result problems such as reduction in flexibility and deterioration of water resistance upon development. The acid value can be adjusted by selecting polymerization ratio upon production of the polymer.

The component (B) has a weight-average molecular weight of preferably 5,000 to 200,000, more preferably 20,000 to 100,000. In case where the weight-average molecular weight is less than 5,000, sufficient film-forming properties cannot be obtained upon filming by coating and drying. In case where the weight-average molecular weight exceeds 200,000, sufficient developability cannot be obtained, causing resolution failure, thus'such molecular weight not being preferred. The weight-average molecular weight is a weight-average molecular weight in terms of polystyrene measured by gel permeation chromatography.

The content of the component (B) is generally 10 to 90 parts by weight, preferably 30 to 70 parts by weight, based on 100 parts of the total amount of the components (A), (B) and (C). In case where the content is less than 10 parts by weight, there results a composition layer having a tacky surface whereas, in case where the content exceeds 90 parts by weight, there results a reduced resistance to sandblasting and a reduced chemical resistance, thus such content not being preferred.

[Photopolymerization Initiator]

As the (C) photopolymerization initiator which the photosensitive composition of the invention for sandblasting contains, there are illustrated 1-hydroxycyclohexyl phenyl ketone, 2,2-dimethoxy-1,2-diphenylethan-1-one, 2-methyl-1-(4-(methylthio)phenyl)-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyldimethylketal, benzyl-β-methoxyethylacetal, 1-phenyl-1,2-propanedione-2-(o-ethoxycarbonyl)oxime, methyl o-benzoylbenzoate, bis(4-dimethylaminophenyl) ketone, 4,4'-bisdiethylaminobenzophenone, 4,4'-dichlorobenzophenone, benzyl, benzoin, benzoin methyl ether, benzoin ethyl ether, benzoin isopropyl ether, benzoin n-butyl ether, benzoin isobutyl ether, p-dimethylaminoacetophenone, p-tert-butyltrichloroacetophenone, p-tert-butyldichloroacetophenone, thioxanthone, 2-methylthioxanthone, 2-isopropylthioxanthone, dibenzosuberone, α,α-dichloro-4-phenoxyacetophenone, pentyl 4-dimethylaminobenzoate, 9-phenylacridine, 1,7-bis-(9-acridinyl)heptane, 1,5-bis-(9-acridinyl)pentane and 1,3-bis-(9-acridinyl)propane. The photopolymerization initiators may be used either independently or as a mixture of two or more thereof.

The content of the component (C) is generally 0.1 to 25 parts by weight, preferably 1 to 15 parts by weight, based on 100 parts of the total amount of the components (A), (B) and (C). In case where the content is less than 0.1 part by weight, there results a cure failure upon exposure, which makes it difficult to obtain a sufficient etching resistance and a sufficient chemical resistance whereas, in case where the content exceeds 25 parts by weight, precipitation takes place in the composition solution, thus such contents not being preferred.

[Photopolymerizable Monomer]

The photosensitive composition of the invention for sandblasting may further contain, if necessary, a photopolymerizable monomer for more improving sensitivity and preventing the cured film from udergoing a decreas in thickness or swelling upon development. As the photopolymerizable monomer, those monomers which have been illustrated as (meth)acrylic esters, ethylenically unsaturated carboxylic acids and other copolymerizable monomers may be used but, preferably, copolymerizable monomers having 2 or more ethylenically unsaturated bonds (hereinafter referred to as "multi-functional monomers") are used. Examples of such multi-functional monomer include diacrylates or dimethacrylates of alkylene glycols such as ethylene glycol and propylene glycol; diacrylates or dimethacrylates of polyalkylene glycols such as polyethylene glycol and polypropylene glycol; polyacrylates or polymethacrylates of polyhydric alcohols such as glycerin, trimethylolpropane, pentaerythritol; and dipentaerythritol or dicarboxylic acid-modified products thereof. Specific examples thereof include ethylene glycol diacrylate, ethylene glycol dimethacrylate, triethylene glycol dimethacrylate, tetraethylene glycol diacrylate, tetraethylene glycol dimethacrylate, propylene glycol diacrylate, propylene glycol dimethacrylate, trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentamethacrylate, dipentaerythritol hexaacrylate and dipentaerythritol hexamethacrylate.

The photopolymerizable monomer is compounded preferably in an amount not exceeding 20 parts by weight per 100 parts by weight of the total amount of the components (A), (B) and (C). In case where the compounded amount exceeds 20 parts by weight, cold flow is liable to take place when the composition is made into a dry film, and the photosensitive composition shows a decreased elasticity after being cured by UV irradfiation, thus sandblasting resistance being reduced.

[Organic Solvent]

The photosensitive composition of the invention for sandblasting is preferably dissolved in an organic solvent before use. As the solvent to be used, there may be illustrated, for example, alcohols such as methanol, ethanol, ethyleneglycol, diethylene glycol and propylene glycol; cyclic ethers such as tetrahydrofuran and dioxane; alkyl ethers of polyhydric alcohols, such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycolmonoethyl ether; alkoxyalkylacetates such as 2-methoxybutyl acetate, 3-methoxybutyl acetate, 4-methoxybutyl acetate, 2-methyl-3-methoxybutyl acetate, 3-methyl-3-methoxybutyl acette, 3-ethyl-3-methoxybutyl acetate, 2-ethoxybutyl acetate and 4-ethoxybutyl acetate; alkyl ether acetates of poloyhydric alcohols, such as ethylene glycol ethyl ether acetate, diethylene glycol ethyl ether acetate, propylene glycol ethyl ether acetate and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone and diacetone alcohol; and esters such as ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate and butyl acetate of these, cyclic ethers, alkyl ethers of polyhydric alcohols, alkyl ether acetates of polyhydric alcohols, ketones and esters are preferred.

The photosensitive composition of the invention for sandblasting can be applied as a liquid to a substrate or screen-printed on a substrate according to the use. In the field where fine processing is required as in production of electronic parts, this photosensitive composition for sandblasting is used preferably in the form of a photosensitive film which is formed by applying the composition onto a flexible film, followed by drying. The photosensitive film can be formed by applying a solution of the photosensitive composition for sandblasting dissolved in a solvent to a flexible film of 15 to 125 $\mu$m in thickness comprising a synthetic resin such as polyethylene terephthalate, polyethylene, polypropylene, polycarbonate or polyvinyl chloride in a dry coating thickness of 10 to 100 $\mu$m using an applicator, a bar coater, a roll coater or a curtain flow coater, followed by drying. It is possible to laminate a releasable film, if necessary, for the purpose of stably protecting the photosensitive composition layer before use. As this releasable film, there may preferably be used polyethylene terephthalate film, polyethylene film or polypropylene film of about 15 to about 125 $\mu$m in thickness having coated or baked thereon silicone.

A water-soluble resin layer can be provided between the flexible film and the photosensitive composition layer in order to prevent the photosensitive layer from being desensitized by oxygen and to prevent a mask pattern from adhering to the photosensitive layer when it is brought into contact with the photosensitive layer for exposure. The water-soluble resin layer is formed preferably by applying a 5 to 20% by weight aqueous solution of a water-soluble polymer such as polyvinyl alcohol or partially saponified polyvinyl acetate in a dry coating thickness of 1 to 10 $\mu$m, followed by drying.

To illustrate an example of methods for using the photosensitive film, the releasable film is stripped off, the photosensitive resin composition layer laid bare is brought into intimate contact with a substrate, the flexible film is stripped off, and a mask having a prescribed mask pattern is brought into intimate contact with the bare surface of the photosensitive layer, followed by irradiating the film with ultraviolet light through the mask. In bringing the photosensitive composition layer into intimate contact with the substrate, it is preferred to employ a so-called thermocompression bonding method in which the substrate is preheated and the photosensitive film is placed thereon and pressed. As an irradiating source for exposure, there are illustrated an eximerlaser, X-rays and electron beams are useful as well as ultraviolet light, and there may be used a low-pressure mercury lamp, a high-pressure mercury lamp, an extremely high-pressure mercury lamp, a xenon lamp, etc. After exposure using the irradiating source, the mask pattern is removed, and development is carried out using a general-purpose alkali developer to dissolve away unexposed areas, thus a pattern being formed. The alkali ingredients to be used in the developer include hydroxides, carbonates, hydrogencarbonates, phosphates and pyrophosphates of alkali metals such as lithium, sodium and potassium; primary amines such as benzylamine and butylamine; secondary amines such as dimethylamine, dibenzylamine and diethanolamine; tertiary amines such as trimethylamine, triethylamine and triethanolamine; cyclic amines such as morpholine, piperazine and pyridine; polyamines such as ethylenediamine and hexamethylenediamine; ammonium hydroxids such as tetramethylammonium hydroxide, tetraethylammonium hydroxide, trimethylbenzylammonium hydroxide and trimethylphenylbenzylammonium hydroxide; sulfonium oxides such as trimethylsulfonium hydroxide, diethylmethylsulfonium hydroxide and dimethylbenzylsulfonium hydroxide; choline; and silicate-containing buffers.

Subsequently, the development-processed substrate is sandblasted using a blasting material to form a desired pattern. As the blasting material, glass beads or inorganic fine particles such as SiC, $SiO_2$, $Al_2O_3$ and ZrO having a particle size of 2 to 500 µm are preferred

EXAMPLES

The invention will now be described in more detail with reference to Examples, but it should be understood that the invention is not construed as being limited thereto.

Example 1

250 parts by weight of a 40% by weight solution of anacrylic copolymer having a copolymerization ratio of methyl methacrylate/butyl methacrylate/methacrylic acid/benzyl methacrylate of 10/35/25/30 (weight-average molecular weight: 70,000; acid value: 190) in methyl ethyl ketone, 40 parts by weight of a urethane acrylate oligomer having polyether structural units in the main chain thereof (SSUA8AL-MH, produced by Kyoeisha) and 20 parts by weight of polyethylene glycol dimethacrylate (n=9) were mixed and, further, 2 parts by weight of a photopolymerization initiator of 2,2-dimethoxy-2-phenylacetophenone, 0.01 part by weight of N-nitrosophenylhydroxylamine aluminum salt and 0.2 part by weight of Malachite Green were added to the mixture, followed by stirring to prepare a photosensitive composition for sandblasting.

The thus-obtained solution of the photosensitive composition for sandblasting was applied to a 20 µm-thick polyethylene terephthalate film (PET film) in a dry coating thickness of 30 µm using an applicator, followed by drying to form a photosensitive composition layer. Subsequently, a 20 µm-thick polyethylene film was adhered onto the photosensitive composition layer under a rubber roller taking care of not entrapping air bubbles, thus a photosensitive film for sandblasting being obtained.

The polyethylene film was stripped off, and the bare photosensitive composition layer was laminated under a rubber roller onto a glass substrate preheated to 80° C. and, after bringing a test pattern mask into intimate contact with the photosensitive composition layer, the photosensitive composition layer was exposed to ultraviolet light emitted from an ultrahigh-pressure mercury lamp at an irradiation amount of 150 mJ/cm$^2$. A 1% sodium hydrogencarbonate aqueous solution kept at 30° C. was sprayed at a spray pressure of $1.47 \times 10^5$ Pa (1.5 kgf/cm$^2$) for 30 seconds to form a pattern.

The resulting photosensitive resin pattern was rectangular and was different from the test mask dimension only by 5 µm, thus having an excellent sharpness and a high accuracy.

Next, resistance of the pattern to sandblasting was evaluated as follows. The polyethylene film was stripped off, and the bare photosensitive composition layer was laminated on a glass substrate preheated to 80° C. by means of a rubber roller, the PET film was then stripped off, and the entire surface of the photosensitive composition layer was exposed to light emitted from an ultrahigh-pressure mercury lamp at an irradiation amount of 150 mJ/cm$^2$ and subjected to sandblasting with an abrasive of glass beads #800 (produced by Alps Engineering) at a blasting pressure of $1.96 \times 10^5$ Pa (2.0 kgf/cm$^2$) from a sandblast nozzle located at a distance of 80 mm. The time required for the cured resin layer to disappear by abrasive wear was measured to be 150 seconds, which shows a good sandblasting resistance.

Example 2

A photosensitive film was prepared in the same manner as in Example 1, except for replacing the acrylic copolymer used in Example 1 with an acrylic copolymer having a copolymerization ratio of methyl methacrylate/butyl methacrylate/methacrylic acid/benzyl methacrylate of 18/55/25/2 by weight (weight-average molecular weight: 70,000; acid value: 160).

Subsequently, a pattern was formed in the same manner as in Example 1. The resulting photosensitive resin pattern was rectangular and was different from the test mask dimension only by 0.5 µm, thus having an excellent sharpness and a high accuracy. Evaluation of resistance to sandblasting in the same manner as in Example 1 revealed that the time required for the cured photosensitive composition layer to disappear by abrasive wear was 145 seconds, which shows a good sandblasting resistance.

Example 3

A photosensitive film was prepared in the same manner as in Example 1, except for replacing the acrylic copolymer used in Example 1 with an acrylic copolymer having a copolymerization ratio of methyl methacrylate/butyl methacrylate/methacrylic acid/styrene of 15/55/25/5 by weight (weight-average molecular weight: 85,000; acid value: 165).

Subsequently, a pattern was formed in the same manner as in Example 1. The resulting photosensitive resin pattern was rectangular and was different from the test mask dimension only by 0.6 µm, thus having an excellent sharpness and a high accuracy. Evaluation of resistance to sandblasting in the same manner as in Example 1 revealed that the time required for the cured photosensitive composition layer to disappear by abrasive wear was 140 seconds, which shows a good sandblasting resistance.

Comparative Example 1

A photosensitive film was prepared in the same manner as in Example 1, except for replacing the acrylic copolymer used in Example 1 with an acrylic copolymer having a copolymerization ratio of methyl methacrylate/butyl methacrylate/methacrylic acid of 20/55/25 by weight (weight-average molecular weight: 75,000; acid value: 160).

Subsequently, a pattern was formed in the same manner as in Example 1. The resulting photosensitive resin pattern was poor in linearity and had a serious rough surface. In addition, it was different from the test mask dimension by 10 µm, thus having a poor sharpness. Evaluation of resistance to sandblasting in the same manner as in Example 1 revealed that the time required for the cured photosensitive composition layer to disappear by abrasive wear was 50 seconds.

The photosensitive composition of the invention for sandblasting is inexpensive, shows a good alkali developability, a high sensitivity, an excellent adhesion to a substrate an an excellent elasticity and flexibility after patterning, and a high resistance to sandblasting, thus being suited for fine processing of a metallic pattern or an insulating pattern. In particular, a photosensitive film made from the composition serves to easily conduct fine processing of electronic parts.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A method for patterning a surface of a substrate, the method comprising, in this order:

provinding on the surface of a substrate, to form a photosensitive composition layer, a photosensitive composition for sandblasting comprising the following components (a), (b), (c) and (d):

(a) a photopolymerizableurethane (meth) acrylateoligomer comprising a reaction product of a compound having a terminal isocyanate group and a (meth)acrylate compound, wherein the compound having a terminal isocyanate group is obtained by reacting (poly) alkylene glycol with an aliphatic diisocyanate compound, and the (meth) acrylate compound has a substituent selected from the group consisting of a hydroxyl group and a carboxyl group, said component (a) comprising 50% by weight or more of urethane (meth) acrylate oligomer comprising polyether structural units in a main chain;

(b) an acrylic copolymer having an acid value of from 50 mgKOH/g to 250 mgKOH/g and comprising, as a monomer unit, a copolymerizable monomer selected from the group consisting of a monomer with at least a benzene ring and a monomer with at least a cyclohexyl group, said component (b) comprising from 2% to 70% by weight of the copolymerizable monomer;

(c) a photopolymerization initiator; and (d) a photopolymerizable monomer selected from the group consisting of diacrylates and dimethacrylates of polyethylene glycol and diacrylates and dimethacrylates of polypropylene glycol, wherein the photosensitive composition has from 10 to 90 parts by weight of the component (a); from 10 to 90 parts by weight of the component (b); from 0.1 to 25 parts by weight of the component (c), based on the total amount of the components (a), (b) and (c), and further wherein component (d) is present in an amount of no more than 20 parts by weight based on 100 parts by weight of the total amount of components (a), (b) and (c);

providing a mask pattern on the photosensitive composition layer;

irradiating the photosensitive layer on which the mask pattern is provided with a light;

removing the mask pattern from the photosensitive composition layer;

carrying out a development to dissolve away unexposed areas of the photosensitive composition layer; and sandblasting the substrate.

* * * * *